United States Patent
Kim et al.

(10) Patent No.: US 10,135,028 B2
(45) Date of Patent: Nov. 20, 2018

(54) FLEXIBLE DISPLAY DEVICE INCLUDING THE CRACK PREVENTING PORTION

(71) Applicant: LG Display Co., Ltd., Seoul (KR)

(72) Inventors: JongSung Kim, Gyeonggi-do (KR); JongGeun Yoon, Gyeonggi-do (KR); Goeun Jung, Gyeonggi-do (KR); HyungGeun Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/332,242

(22) Filed: Oct. 24, 2016

(65) Prior Publication Data

US 2017/0346041 A1     Nov. 30, 2017

(30) Foreign Application Priority Data

May 26, 2016  (KR) ......................... 10-2016-0065082

(51) Int. Cl.
| | |
|---|---|
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ...... *H01L 51/5256* (2013.01); *H01L 27/3244* (2013.01); *H01L 51/0097* (2013.01); *H01L 2251/5338* (2013.01)

(58) Field of Classification Search
CPC ............ H01L 51/5253; H01L 27/3246; H01L 51/5246; H01L 27/323; H01L 51/0097; H01L 51/5256; H01L 51/56

USPC ........................................ 257/40, 57; 438/23
See application file for complete search history.

(56) References Cited

U.S. PATENT DOCUMENTS

| | | | | |
|---|---|---|---|---|
| 2003/0164674 | A1* | 9/2003 | Imamura ................ | H05B 33/04 313/493 |
| 2009/0009069 | A1* | 1/2009 | Takata ................ | H01L 27/3246 313/504 |
| 2009/0273589 | A1* | 11/2009 | Asano ................. | H01L 27/3246 345/204 |
| 2015/0255740 | A1* | 9/2015 | Nakada ............... | H01L 51/0097 257/40 |
| 2016/0204373 | A1* | 7/2016 | Park ..................... | H01L 27/3244 257/40 |
| 2016/0293884 | A1* | 10/2016 | Zhang ................ | H05B 33/0896 |
| 2016/0307971 | A1* | 10/2016 | Jeon ..................... | H01L 27/3258 |
| 2016/0315284 | A1* | 10/2016 | Jeon ..................... | H01L 51/5246 |
| 2017/0062717 | A1* | 3/2017 | Khachatryan ......... | H01L 51/003 |
| 2017/0117502 | A1* | 4/2017 | Park ..................... | H01L 27/3246 |
| 2017/0288004 | A1* | 10/2017 | Kim ..................... | H01L 27/3276 |

* cited by examiner

*Primary Examiner* — Thao X Le
*Assistant Examiner* — Nduka Ojeh
(74) *Attorney, Agent, or Firm* — Morgan, Lewis & Bockius LLP

(57) ABSTRACT

A flexible display device includes a base substrate defining a display area and a non-display area; a thin film transistor in the display area of the base substrate; an organic light emitting diode on and connected with the thin film transistor; an encapsulation layer on the organic light emitting diode; and a crack preventing portion in the non-display area defined by the base substrate.

17 Claims, 8 Drawing Sheets

FLEXIBLE DISPLAY DEVICE INCLUDING THE CRACK PREVENTING PORTION

This application claims the benefit of the Korean Patent Application No. 10-2016-0065082 filed on May 26, 2016, which is hereby incorporated by reference as if fully set forth herein.

BACKGROUND

Field of the Disclosure

The present invention relates to a display device, and more particularly, to a flexible display device.

Discussion of the Related Art

With the advancement of the information-oriented society, various requirements for display devices have been increasing. Recently, various type display devices, such as liquid crystal display (LCD) devices, plasma display panel (PDP) devices, organic light emitting display (OLED) devices, etc., have been developed.

In particular, because the LCD device and the OLED device, which include a thin film transistor, have advantages of good resolution, color display, and good picture quality, they are widely used for display devices in televisions, notebook computers, tablet computers, and desktop computers. Also, the LCD devices and OLED devices have been developed as flexible display devices.

A related art flexible display device includes a base substrate, a thin film transistor, an organic light emitting device, and an encapsulation layer. The base substrate may be a flexible plastic film. The thin film transistor is prepared on the base substrate. The organic light emitting device is formed on the thin film transistor, and is electrically connected with the thin film transistor. The encapsulation layer is provided on the thin film transistor and the organic light emitting device. The encapsulation layer protects the thin film transistor and the organic light emitting device from external shocks and prevents moisture from permeating into the flexible display panel. The encapsulation layer may include an inorganic film. In this case, the inorganic film may extend from an upper side of the organic light emitting device and may be disposed in the outermost region of the flexible display panel. However, if the related art flexible display device is curved or bent, a stress may be concentrated in the inorganic film disposed in the outermost region of the flexible display panel, thereby causing cracks. The cracks may cause a permeation path for moisture. That is, moisture may be permeated into the inside of the flexible display panel through the cracks occurring in the inorganic film, thereby lowering the reliability of the flexible display panel.

SUMMARY

Accordingly, embodiments of the present invention are directed to a flexible display device that substantially obviates one or more problems due to limitations and disadvantages of the related art.

An object of the present invention is to provide a flexible display device that prevents cracks in an inorganic film provided in a non-display area of a display panel, thereby preventing moisture permeation into the inside of the display panel through the cracks.

Additional features advantages of the invention will be set forth in the description that follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of embodiments of the invention, as embodied and broadly described herein, flexible display device comprises a base substrate defining a display area and a non-display area; a thin film transistor in the display area of the base substrate; an organic light emitting diode on and connected with the thin film transistor; an encapsulation layer on the organic light emitting diode; and a crack preventing portion in the non-display area defined by the base substrate.

It is to be understood that both the foregoing general description and the following detailed description of the present invention are exemplary and explanatory and are intended to provide further explanation of embodiments of the invention as claimed.

BRIEF DESCRIPTION OF THE DRAWINGS

The accompanying drawings, which are included to provide a further understanding of the invention, and are incorporated in and constitute a part of this application, illustrate embodiments of the invention and together with the description serve to explain the principles of the invention. In the drawings.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a flexible display device according to example embodiments of the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
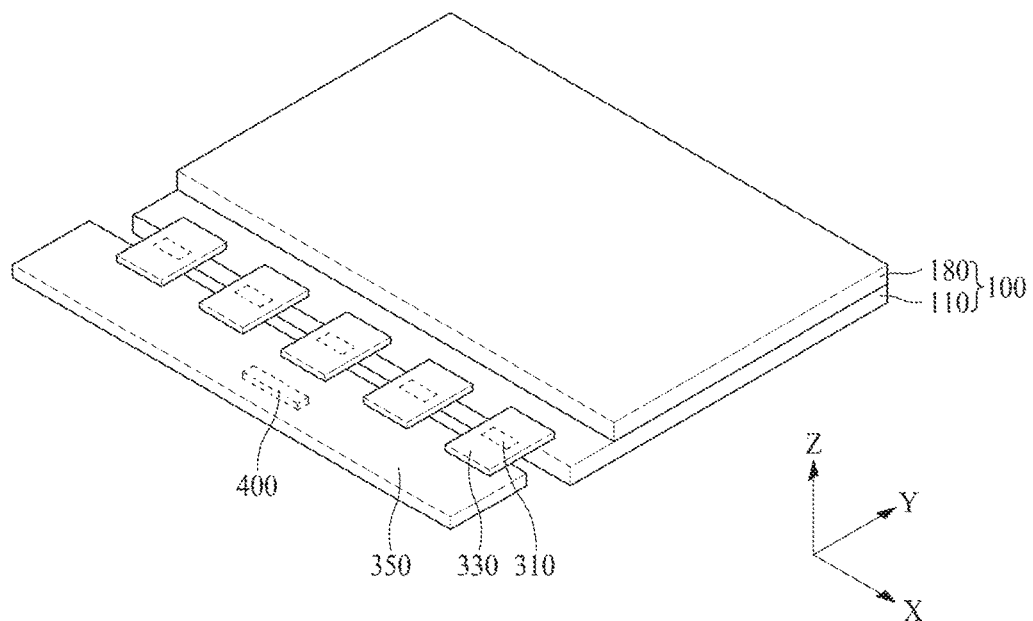
FIG. 1 is a perspective view illustrating a flexible display device according to an example embodiment of the present invention.
Figure 2:
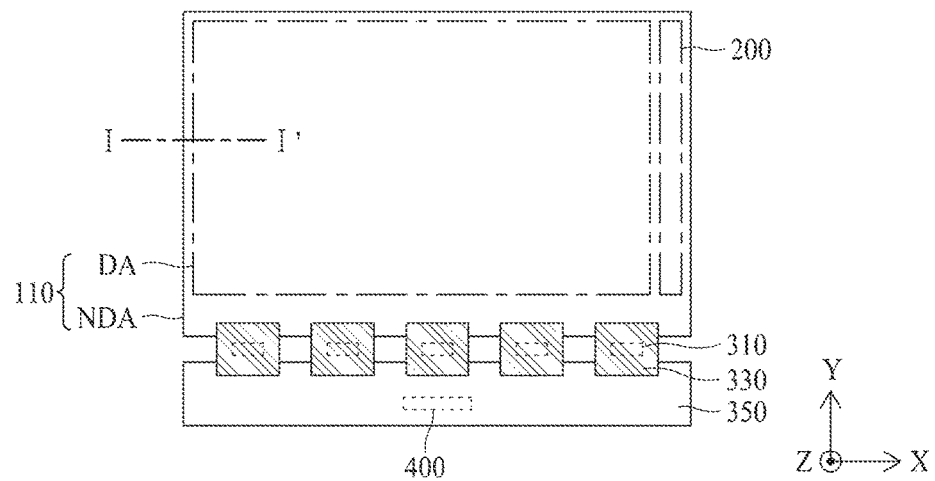
FIG. 2 is a plane view illustrating a base substrate, a gate driver, a source drive IC, a flexible film, a circuit board, and a timing controller for the flexible display device of FIG. 1.

FIG. 1 is a perspective view illustrating a flexible display device according to an example embodiment of the present invention. FIG. 2 is a plane view illustrating a base substrate, a gate driver, a source drive IC, a flexible film, a circuit board, and a timing controller for a display device of FIG. 1. In FIGS. 1 and 2, the X-axis indicates a direction being parallel to a gate line, the Y-axis indicates a direction being parallel to a data line, and the Z-axis indicates a height direction of the flexible display device.

With reference to FIGS. 1 and 2, the flexible display device may include a display panel 100, a gate driver 200, a source drive integrated circuit (hereinafter, referred to as "source drive IC") 310, a flexible film 330, a circuit board 350, and a timing controller 400. The display panel 100 may include a base substrate 110 and an encapsulation layer 180. On one surface of the base substrate 110 confronting the encapsulation layer 180, there are gate lines, data lines, and pixels. The pixels may include a plurality of subpixels, wherein the subpixels are formed at crossing regions of the gate and data lines.

Each of the plurality of subpixels may include at least one thin film transistor and organic light emitting device. If at least one thin film transistor is turned on by a gate signal of the gate line, a data voltage is supplied to each of the plurality of subpixels through the data line. Each of the plurality of subpixels controls a current flowing to the organic light emitting device in accordance with the data voltage, whereby the organic light emitting device emits light with a predetermined brightness.

As shown in FIG. 2, the display panel 100 may include a display area (DA) on which an image is displayed, and a non-display area (NDA) on which an image is not displayed. In the display area (DA), there are the gate lines, the data lines, and the pixels. In the non-display area (NDA), there are the gate driver 200 and pads. The display panel 100 will be described in detail with reference to FIGS. 3 to 11.

The gate driver 200 supplies the gate signals to the gate lines in accordance with a gate control signal which is provided from the timing controller 400. The gate driver 200 may be formed in the non-display area (NDA) at one outer side or two outer sides of the display area (DA) by a GIP (gate driver in panel) method. The gate driver 200 may be manufactured in a driving chip, mounted on the flexible film 330, and attached to the non-display area (NDA) at one outer side or two outer sides of the display area (DA) by a TAB (tape automated bonding) method.

The source drive IC 310 provides digital video data and source control signal from the timing controller 400. The source drive IC 310 converts the digital video data into analog data voltages in accordance with a source control signal, and supplies the analog data voltages to the data lines. If the source drive IC 310 is manufactured in a driving chip, the source drive IC 310 may be mounted on the flexible film 330 by a COF (chip on film) or COP (chip on plastic) method.

Pads, such as data pads, are provided in the non-display area (NDA) of the display panel 100. Lines for connecting the pads with the source drive IC 310 and lines for connecting the pads with lines of the circuit board 350 are provided in the flexible film 330. The flexible film 330 is attached onto the pads by an anisotropic conducting film so that the pads may be connected with the lines of the flexible film 330.

The circuit board 350 may be attached to the flexible film 330. A plurality of circuits, which are manufactured in driving chips, may be mounted on the circuit board 350. For example, the timing controller 400 may be mounted on the circuit board 350. The circuit board 350 may be a printed circuit board or a flexible printed circuit board.

The timing controller 400 provides digital video data and timing signals from an external system board through a cable. The timing controller 400 generates the gate control signal for controlling an operation timing of the gate driver 200 and generates the source control signal for controlling the source drive ICs 310. Then, the timing controller 400 supplies the gate control signal to the gate driver 200 and supplies the source control signal to the source drive ICs 310.

Figure 3:
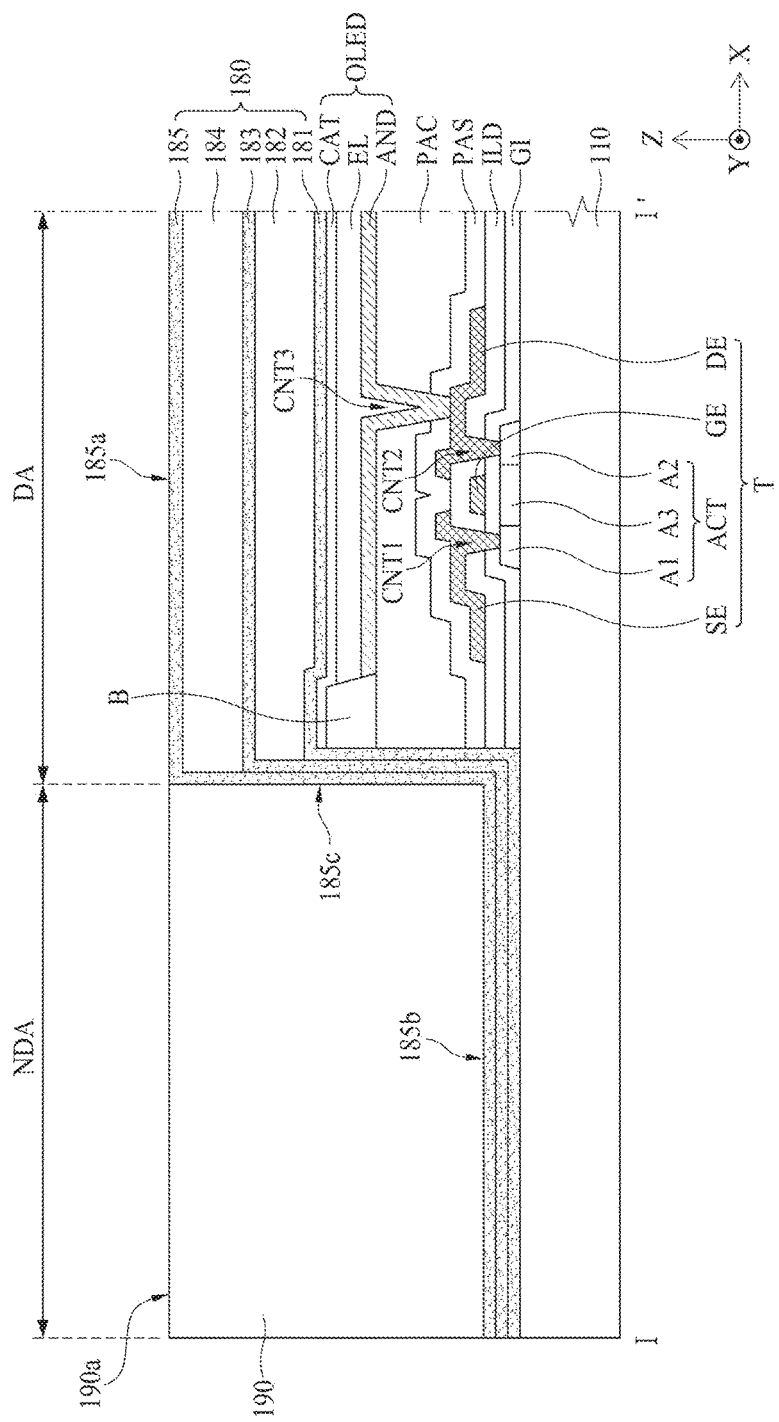
FIG. 3 is a cross sectional view illustrating a flexible display device according to a first example embodiment of the present invention.

FIG. 3 is a cross sectional view illustrating a flexible display device according to a first example embodiment of the present invention, which is a cross sectional view along I-I' of FIG. 2.

As illustrated in FIG. 3, the flexible display device may include a base substrate 110, a thin film transistor (T), a passivation layer (PAS), a planarization layer (PAC), an organic light emitting diode (OLED), an encapsulation layer 180, and a crack preventing portion 190. The base substrate 110 may be a flexible plastic film. For example, the base substrate 110 may be a sheet or film including a cellulose resin, such as TAC (triacetyl cellulose) or DAC (diacetyl cellulose), COP (cyclo olefin polymer), such as Norbornene derivatives, COC (cyclo olefin copolymer), an acrylic resin, such as PMMA (poly(methylmethacrylate), a polyolefin, such as PC (polycarbonate), PE (polyethylene) or PP (polypropylene), a polyester, such as PVA (polyvinyl alcohol), PES (poly ether sulfone), PEEK (polyetheretherketone), PEI (polyetherimide), PEN (polyethylenenaphthalate), PET (polyethyleneterephthalate), or the like, PI (polyimide), PSF (polysulfone), or fluoride resin, but not limited to these materials.

A buffer layer may be additionally provided on the base substrate 110. The buffer layer may be provided on an entire upper surface of the base substrate 110. The buffer layer prevents moisture permeation from the base substrate 110 into the inside of the display panel 100, especially if the base substrate 110 is vulnerable to the moisture permeation. Also, the buffer layer prevents foreign matters, such as metal ions of the base substrate 110, from being diffused and permeated into an active layer (ACT) of the thin film transistor (T). The buffer layer may be formed of an inorganic insulating material, for example, in a single-layered structure or multi-layered structure of SiO$_2$(silicon dioxide), SiNx (silicon nitride), or SiON (silicon oxynitride), but is not limited to these structures.

The thin film transistor (T) is disposed on the display area (DA) of the base substrate 110. The thin film transistor (T) may include the active layer (ACT), a gate insulating film (GI), a gate electrode (GE), an insulating interlayer (ILD), a source electrode (SE), and a drain electrode (DE).

The active layer (ACT) is provided on the base substrate 110 of the display area (DA). The active layer (ACT) is overlapped with the gate electrode (GE). The active layer (ACT) may include one end area (A1) positioned at the side of the source electrode (SE), the other end area (A2) positioned at the side of the drain electrode (DE), and a central area (A3) positioned between one end area (A1) and the other end area (A2). The central area (A3) may be formed of a semiconductor material which is not doped with dopant, and one end area (A1) and the other end area (A2) may be formed of a semiconductor material doped with dopant.

The gate insulating film (GI) is provided on the active layer (ACT). The gate insulating film (GI) insulates the active layer (ACT) and the gate electrode (GE) from each other. The gate insulating film (GI), which covers the active layer (ACT), is provided on an entire surface of the display area (DA). For example, the gate insulating film (GI) may be formed of an inorganic insulating material, for example, in a single-layered structure or multi-layered structure of SiO$_2$ (silicon dioxide), SiNx (silicon nitride), or SiON (silicon oxynitride), but is not limited to these structures.

The gate electrode (GE) is provided on the gate insulating film (GI). The gate electrode (GE) overlaps with the central area (A3) of the active layer (ACT), wherein the gate insulating film (GI) is interposed between the gate electrode (GE) and the central area (AC) being overlapped with each other. For example, the gate electrode (GE) may be formed in a single-layered structure or multi-layered structure of any one of molybdenum (Mo), aluminum (Al), chrome (Cr), gold (Au), titanium (Ti), nickel (Ni), neodymium (Nd), copper (Cu), or their alloys, but is not limited to these structures.

The insulating interlayer (ILD) is provided on the gate electrode (GE). The insulating interlayer (ILD) is provided on an entire surface of the display area (DA) including the gate electrode (GE). For example, the insulating interlayer (ILD) is formed of the same inorganic insulating material as that of the gate insulating film (GI), for example, single-layered structure or multi-layered structure of SiO$_2$(silicon dioxide), SiNx (silicon nitride), or SiON (silicon oxynitride), but is not limited to these structures.

The source electrode (SE) and the drain electrode (DE) are disposed on the insulating interlayer (ILD), wherein the source electrode (SE) and the drain electrode (DE) are provided at a predetermined interval from each other. A first contact hole (CNT1) for exposing a predetermined portion of one end area (A1) of the active layer (ACT), and a second contact hole (CNT2) for exposing a predetermined portion of the other end area (A2) of the active layer (ACT) are in the gate insulating film (GI) and the insulating layer (ILD). The source electrode (SE) is connected with one end area (A1) of the active layer (ACT) via the first contact hole (CNT1), and the drain electrode (DE) is connected with the other end area (A2) of the active layer (ACT) via the second contact hole (CNT2). A structure of the thin film transistor layer (T) is not limited to the above structure, that is, a structure of the thin film transistor layer (T) may be changed to various shapes generally known to those in the art.

The passivation layer (PAS) is provided on the thin film transistor (T). The passivation layer (PAS) protects the thin film transistor (T). The passivation layer (PAS) is provided on the display area (DA) of the base substrate 110. The passivation layer (PAS) is not provided on the non-display area (NDA) of the base substrate 110. The passivation layer (PAS) may be formed of an inorganic insulating material, for example, in a single-layered structure or multi-layered structure of SiO$_2$(silicon dioxide), SiNx (silicon nitride), or SiON (silicon oxynitride), but is not limited to these structures.

The planarization layer (PAC) is provided on the passivation layer (PAS). The planarization layer (PAC) is provided to planarize an upper surface of the base substrate 110 with the thin film transistor (T). The planarization layer (PAC) may be formed of an organic insulating material, for example, acryl resin, epoxy resin, phenolic resin, polyamide resin, polyimide resin, etc., but is not limited to these materials. A third contact hole (CNT3) for exposing the drain electrode (DE) of the thin film transistor (T) are in the passivation layer (PAS) and the planarization layer (PAC). The drain electrode (DE) and an anode electrode (AND) of the organic light emitting diode (OLED) are electrically connected with each other via the third contact hole (CNT3).

The organic light emitting diode (OLED) is provided on the thin film transistor (T). The organic light emitting diode (OLED) may include the anode electrode (AND), an organic layer (EL), and a cathode electrode (CAT). The anode electrode (AND) is connected with the drain electrode (DE) of the thin film transistor (T) via the third contact hole (CNT3) provided in the passivation layer (PAS) and the planarization layer (PAC). Also, a bank (B) is provided between the neighboring anode electrodes (AND) such that the neighboring anode electrodes (AND) are electrically insulated from each other by the bank (B) provided in-between. The bank (B) may be formed of an organic insulating material, for example, polyimide resin, acryl resin, benzocyclobutene (BCB), etc., but not limited to these materials.

The organic layer (EL) is provided on the anode electrode (AND). The organic layer (EL) may include a hole transporting layer, an organic light emitting layer, and an electron transporting layer. Furthermore, the organic layer (EL) may include at least one functional layer for improving light emission efficiency and/or lifespan of the light emitting layer.

The cathode electrode (CAT) is provided on the organic layer (EL) and the bank (B). If a voltage is applied to the anode electrode (AND) and the cathode electrode (CAT), hole and electron are transferred to the organic light emitting layer via the hole transporting layer and the electron transporting layer, and are then combined with each other in the organic light emitting layer, thereby emitting light.

The encapsulation layer 180 is provided on the organic light emitting diode (OLED). The encapsulation layer 180 protects the thin film transistor (T) and the organic light emitting diode (OLED) from an external shock, and prevents moisture permeation into the display panel 100.

The encapsulation layer 180 may include a plurality of inorganic films and a plurality of organic films that are alternately deposited. Each of the plurality of inorganic films, which extends from the display area (DA), is disposed on the base substrate 110 of the non-display area (NDA). Each of the plurality of organic films is disposed in the display area (DA), and is interposed between each of the inorganic films. In detail, the encapsulation layer 180 includes first, second, and third inorganic films 181, 183, and 185, and first and second organic films 182 and 184.

The first inorganic film 181 is disposed in the lowermost layer of the encapsulation layer 180. The first inorganic film 181 seals the organic light emitting diode (OLED), the bank (B), the planarization layer (PAC), the passivation layer (PAS), and the thin film transistor (T) disposed in the display area (DA). The first inorganic film 181, which extends from the display area (DA), is provided on the base substrate 110 of the non-display area (NDA). The first inorganic film 181 may be formed of an inorganic insulating material, for example, a single-layered structure or multi-layered structure of $SiO_2$ (silicon dioxide), SiNx (silicon nitride), or SiON (silicon oxynitride), but is not limited to these structures.

The first organic film 182 is provided on the first inorganic film 181 disposed in the display area (DA). If the display panel 100 is curved or bent, the first organic film 182 prevents cracks from occurring in the first inorganic film 181 by a stress. The first organic film 182 may be formed of an organic insulating material, for example, acryl resin, epoxy resin, phenolic resin, polyamide resin, or polyimide resin, but is not limited to these materials.

The second inorganic film 183 is provided on the first inorganic film 181 and the first organic film 182. The second inorganic film 183 seals the first organic film 182 disposed in the display area (DA). The second inorganic film 183 covers upper and lateral surfaces of the first organic film 182. According as the first organic film 182 is sealed by the second inorganic film 183, it is possible to prevent moisture permeation into the first organic film 182, which is vulnerable to the moisture permeation. The second inorganic film 183, which extends from the display area (DA), is provided on the first inorganic film 181 disposed in the non-display area (NDA). The first and second inorganic films 181 and 183 provided in the non-display area (NDA) are brought into contact with each other. In this case, the second inorganic film 183 may be formed of the same material as the first inorganic film 181, but it is not necessary. If the first and second inorganic films 181 and 183 are formed of the same material, it is possible to enhance an interfacial adhesion strength between the first and second inorganic films 181 and 183. Accordingly, first and second inorganic films 181 and 183 that are formed of the same material prevent the moisture permeation into the display panel 100 much more efficiently than first and second inorganic films 181 and 183 that are formed of the different materials.

The second organic film 184 is provided on the second inorganic film 183 disposed in the display area (DA). If the display panel 100 is curved or bent, the second organic film 184 prevents cracks from occurring in the second inorganic film 183 by a stress. The second organic film 184 may be formed of the same material as the first organic film 182, but is not necessarily.

The third inorganic film 185 is disposed in the uppermost layer of the encapsulation layer 180. The third inorganic film 185 is provided on the second organic film 184 and the second inorganic film 183. The third inorganic film 185 seals the second organic film 184 disposed in the display area (DA). The third inorganic film 185 covers upper and lateral surfaces of the second organic film 184. Because the second organic film 184 is sealed by the third inorganic film 185, moisture permeation into the second organic film 184, which is vulnerable to the moisture permeation, can be prevented. The third inorganic film 185, which extends from the display area (DA), is provided on the second inorganic film 183 disposed in the non-display area (NDA). The second and third inorganic films 183 and 185 in the non-display area (NDA) are brought into contact with each other.

In one example, the encapsulation layer 180 includes the three inorganic films and the two organic films that are alternately deposited, but is not limited to this structure. For example, the encapsulation layer 180 may include at least two inorganic films and at least one organic film alternately deposited. However, for effective moisture permeation, the uppermost and lowermost layers of the encapsulation layer 180 may be formed of inorganic films. Also, the organic film interposed between each of the inorganic films may be sealed by the inorganic films.

The crack preventing portion 190 is disposed in the non-display area (NDA) of the base substrate 110. If the display panel 100 is curved, the crack preventing portion 190 prevents cracks from occurring in the plurality of inorganic films 181, 183, and 185 by a stress concentration in the inorganic films 181, 183, and 185.

The crack preventing portion 190 is provided on the third inorganic film 185, which is the uppermost layer among the plurality of inorganic films 181, 183, and 185 provided in the non-display area (NDA). The third inorganic film 185 includes a first upper surface 185a, a second upper surface 185b, and a lateral surface 185c. The first upper surface 185a of the third inorganic film 185 is provided in the display area (DA), the second upper surface 185b is provided in the non-display area (NDA), and the lateral surface 185c connects the first upper surface 185a and the second upper surface 185b with each other. The crack preventing portion 190 covers the second upper surface 185b and the lateral surface 185c of the third inorganic film 185. To realize flatness in an upper surface of the display panel 100, an upper surface 190a of the crack preventing portion 190 is positioned at the same height as that of the first upper surface 185a of the third inorganic film 185. The crack preventing portion 190 may be formed of the same material as that of at least one of the organic films 182 and 184 included in the encapsulation layer 180, but this is not necessary. The crack preventing portion 190 may be formed of the different material from that of the organic films 182 and 184. In this case, a thickness of the crack preventing portion 190 may be within a range of 0.1 μm to 10 μm. For example, the crack preventing portion 190 may be formed by an inkjet process, a screen printing process, or a flash evaporation process, but is not limited to these processes.

If the encapsulation layer 180 including the inorganic film and the organic film is provided in the non-display area (NDA) of the display panel 100, moisture may be permeated through the organic film exposed in the outermost area of the display panel 100. To prevent this problem, if only the inorganic film is disposed in the non-display area (NDA), a stress may be concentrated in the inorganic film of the curved display panel 100, which might cause cracks in the inorganic film. Accordingly, moisture may be permeated into the display panel 100 through the cracks.

However, the inorganic films included in the encapsulation layer 180 seal the organic films included in the encapsulation layer 180, and the crack preventing portion 190 of the organic insulating material is provided in the non-display area (NDA). Accordingly, even if the display panel 100 of the flexible display device is curved, stress occurring in the inorganic films disposed in the non-display area (NDA) can be decreased, thereby preventing cracks. Also, moisture permeation into the display panel 100 can be prevented, thereby improving reliability of the flexible display device.

Figure 4:
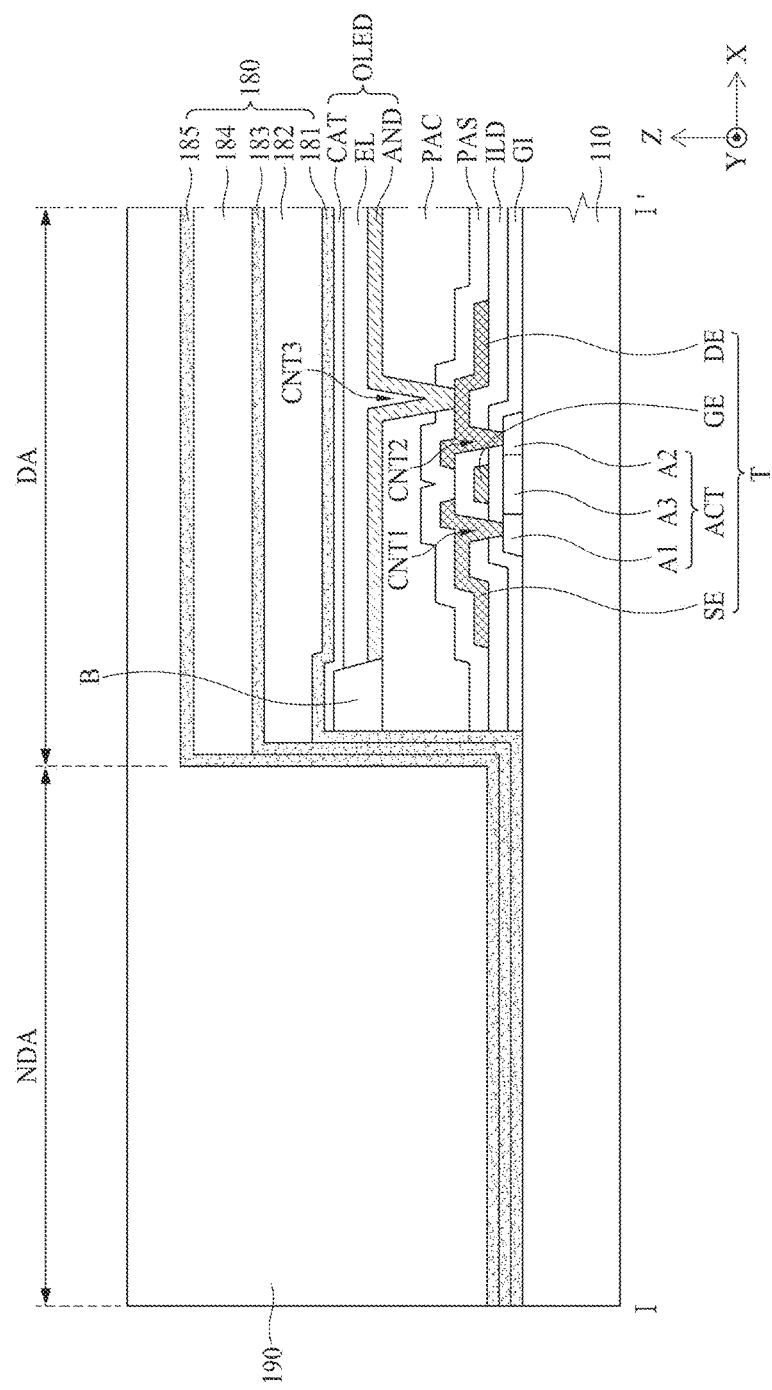
FIG. 4 is a cross sectional view illustrating a flexible display device according to a second example embodiment of the present invention.

FIG. 4 is a cross sectional view illustrating a flexible display device according to a second example embodiment of the present invention. Except a crack preventing portion 190 prepared on entire upper surfaces of display area (DA)

and non-display area (NDA), the flexible display device according to the second example embodiment of the present invention is similar to the same as the flexible display device according to the first example embodiment of the present invention shown in FIG. 3. Thus, the same reference numbers will be used throughout the drawings to refer to the similar or like parts, and a detailed description for the similar parts will be omitted.

In the example of FIG. 4, the crack preventing portion 190 is provided on an entire upper surface of a base substrate 110. The crack preventing portion 190 is disposed in the display area (DA) and the non-display area (NDA) of a display panel 100. The crack preventing portion 190 covers an entire upper surface of an encapsulation layer 180. The crack preventing portion 190 is prepared on a third inorganic film 185, which is the uppermost layer among inorganic films 181, 183, and 185 provided in the display area (DA) and the non-display area (NDA).

In the flexible display, the inorganic films included in the encapsulation layer 180 seal organic films included in the encapsulation layer 180, and the crack preventing portion 190 of an organic insulating material is provided on the entire upper surface of the encapsulation layer 180. Accordingly, even if the flexible display panel 100 is curved, stress occurring in the inorganic films disposed in the non-display area (NDA) can be decreased, thereby preventing cracks. Also, reliability of the flexible display device can be improved.

In comparison to the first example embodiment of the present invention in which the crack preventing portion 190 is provided only in the non-display area (NDA), the crack preventing portion 190 according to the second example embodiment of the present invention is provided in the entire upper surface of the encapsulation layer 180 such that it is possible to prevent the boundaries between the display area (DA) and the non-display area (NDA). Thus, even if the display panel 100 is curved, the crack preventing portion 190 can be prevented from being separated from the third inorganic film 185 disposed in the display area (DA) by the boundaries between the display area (DA) and the non-display area (NDA).

Figure 5:
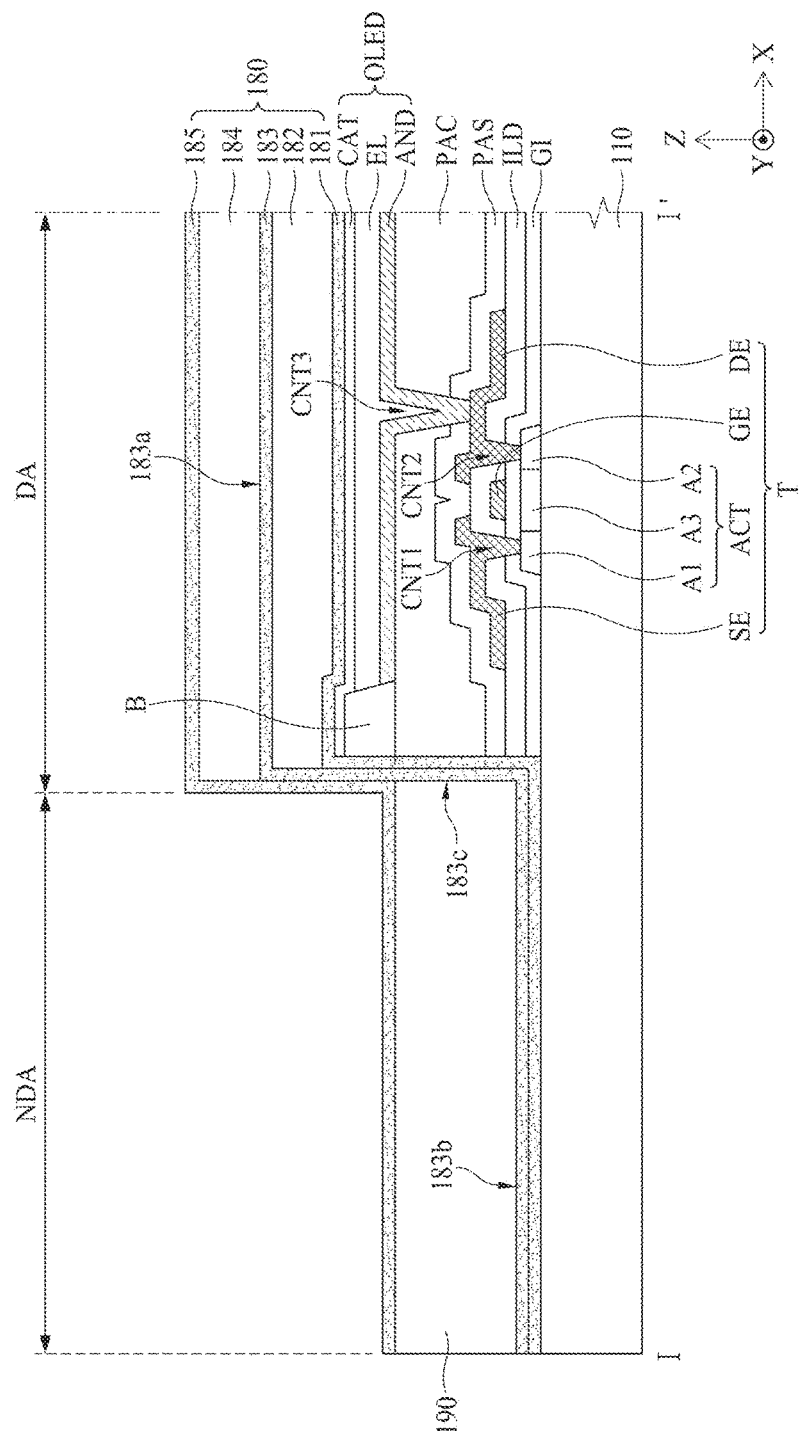
FIG. 5 is a cross sectional view illustrating a flexible display device according to a third example embodiment of the present invention.

FIG. 5 is a cross sectional view illustrating a flexible display device according to a third example embodiment of the present invention. With the exception of a crack preventing portion 190 prepared between a second inorganic film 183 and a third inorganic film 185 prepared in a non-display area (NDA), the flexible display device according to the third example embodiment of the present invention is similar to the flexible display device according to the first example embodiment of the present invention shown in FIG. 3 so that the same reference numbers will be used throughout the drawings to refer to the similar or like parts, and a detailed description for the similar parts will be omitted.

With reference to FIG. 5, an encapsulation layer 180 may include a plurality of inorganic films and a plurality of organic films that are alternately deposited. The plurality of inorganic films 181, 183, and 185, which extend from a display area (DA), are disposed in the non-display area (NDA). Each of the organic films 182 and 184 is prepared between each of the plurality of inorganic films 181, 183, and 185.

The crack preventing portion 190 is provided between the second and third inorganic films 183 and 185 among the plurality of inorganic films 181, 183, and 185 provided in the non-display area (NDA). The second inorganic film 183 is provided on the first inorganic film 181. The second inorganic film 183 includes a first upper surface 183a, a second upper surface 183b, and a lateral surface 183c. The first upper surface 183a of the second inorganic film 183 is provided in the display area (DA), the second upper surface 183b is provided in the non-display area (NDA), and the lateral surface 183c connects the first upper surface 183a and the second upper surface 183b with each other. The second organic film 184 is provided on the first upper surface 183a of the second inorganic film 183. The crack preventing portion 190 is provided on the second upper surface 183b of the second inorganic film 183. The crack preventing portion 190 covers the second upper surface 183b and a predetermined portion of the lateral surface 183c of the second inorganic film 183. The crack preventing portion 190 may be formed of the same material as that of the second organic film 184, and the crack preventing portion 190 and the second organic film 184 may be manufactured at the same time, but is not necessarily limited to this configuration. The crack preventing portion 190 may be formed of a different material from the second organic film 184.

The third inorganic film 185 is prepared on the second organic film 184 and the crack preventing portion 190. The third inorganic film 185, which extends from the display area (DA), covers an upper surface of the crack preventing portion 190 in the non-display area (NDA). The third inorganic film 185 seals the second organic film 184.

In the flexible display device according to the third example embodiment of the present invention, the crack preventing portion 190 is provided between the second and third inorganic films 183 and 185 among the plurality of inorganic films 181, 183, and 185 disposed in the non-display area (NDA). For example, the crack preventing portion 190 may be prepared between the first and second inorganic films 181 and 183. In this case, the crack preventing portion 190 may be formed of the same material as that of the first organic film 182, and the crack preventing portion 190 and the first organic film 182 may be manufactured at the same time. Also, the crack preventing portion 190 may be prepared between the first and second inorganic films 181 and 183, and between the second and third inorganic films 183 and 185.

In the flexible display device according to the third example embodiment of the present invention, the plurality of inorganic films 181, 183, and 185 included in the encapsulation layer 180 seals the organic films 182 and 184 disposed in the display area (DA), and the crack preventing portion 190 is provided between each of the inorganic films 181, 183, and 185 provided in the non-display area (NDA). Accordingly, even if the flexible display panel 100 is curved, stress occurring in the inorganic films disposed in the non-display area (NDA) can be decreased, thereby preventing cracks. As a result, reliability of the flexible display device can be improved. Also, the crack preventing portion 190 and the first organic film 182 may be manufactured at the same time, thereby preventing cracks in the inorganic films in the non-display area (NDA) without an additional mask process.

In comparison to the first example embodiment of the present invention in which the crack preventing portion 190 is provided only in the non-display area (NDA), the third example embodiment of the present invention includes the third inorganic film 185 which is the uppermost layer of the display panel 100 so that it is possible to prevent the boundaries between the display area (DA) and the non-display area (NDA). Thus, even if the display panel 100 is curved, the crack preventing portion 190 can be prevented from being separated from the inorganic film disposed in the display area (DA) by the boundaries between the display area (DA) and the non-display area (NDA).

Figure 6:
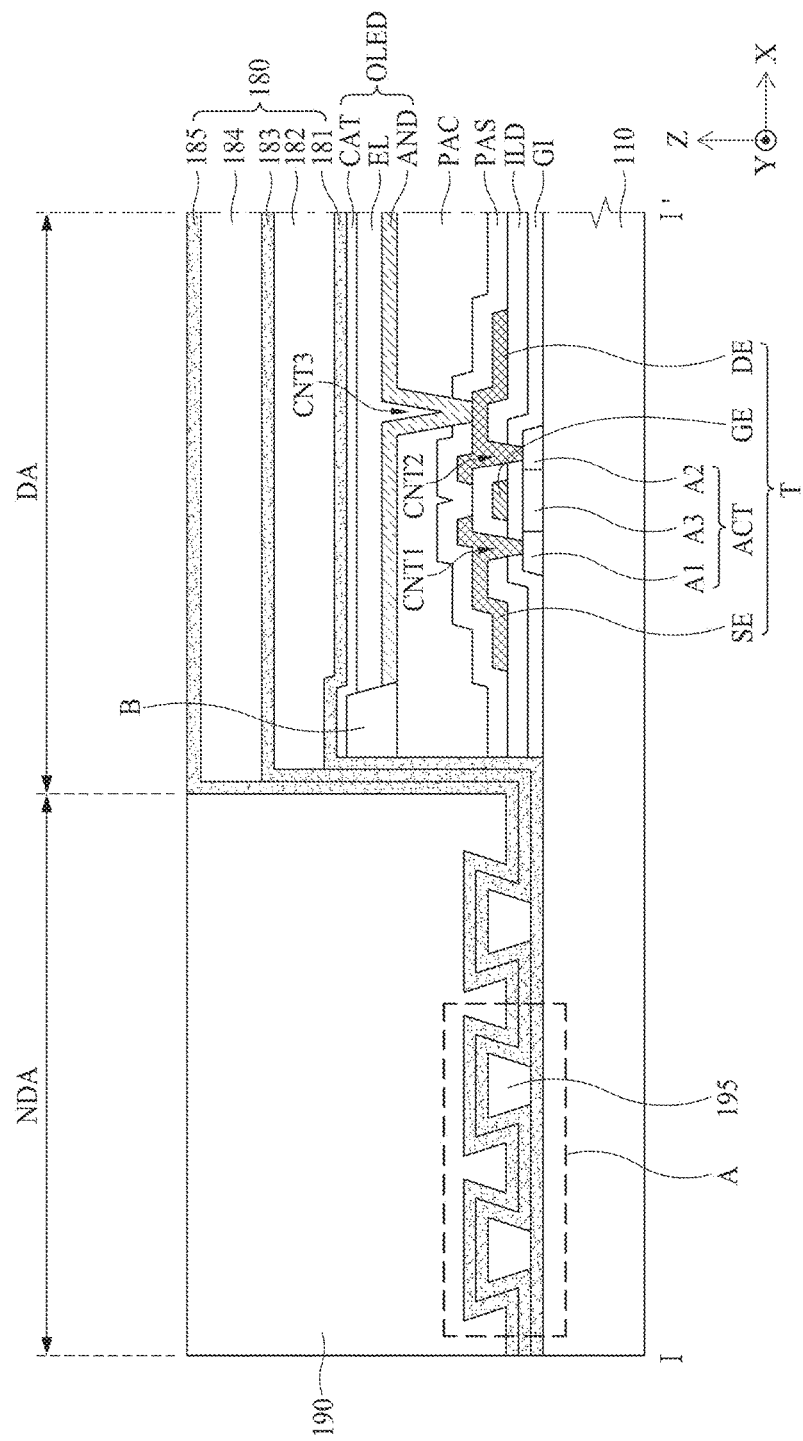
FIG. 6 is a cross sectional view illustrating a flexible display device according to a fourth example embodiment of the present invention.

FIG. 6 is a cross sectional view illustrating a flexible display device according to a fourth example embodiment of the present invention. With the exception of a crack preventing bump 195, which is additionally provided in a non-display area (NDA), the flexible display device according to the fourth example embodiment of the present invention is similar to the flexible display device according to the first example embodiment of the present invention shown in FIG. 3 so that only the crack preventing bump 195 and related parts will be described in detail.

As shown in FIG. 6, at least one crack preventing bump 195 may be prepared in the non-display area (NDA) of the flexible display device according to the fourth embodiment of the present invention. If scribing or bending a display panel 100, the crack preventing bump 195 prevents cracks from occurring in inorganic films disposed in the non-display area (NDA).

The crack preventing bump 195 is provided on the first inorganic film 181 disposed in the non-display area (NDA), but is not limited to this structure. The crack preventing bump 195 may be prepared between the second inorganic film 183 and the third inorganic film 185 disposed in the non-display area (NDA). The crack preventing bump 195 may have a reverse-tapered shape, that is, a width in an upper surface of the crack preventing bump 195 is larger than a width in a lower surface of the crack preventing bump 195, but is not limited to this shape. In this case, a thickness of the crack preventing bump 195 is within a range of 0.1 μm to 10 μm. The crack preventing bump 195 may be formed of an inorganic insulating material, for example, SiNx (silicon nitride), but is not limited to this material. Various shapes of the crack preventing bump 195 may be described later with reference to FIGS. 7A to 7C. The second inorganic film 183 and the third inorganic film 185 may be sequentially provided on the crack preventing bump 195. Then, a crack preventing portion 190 is prepared on the third inorganic film 185.

In the fourth example embodiment of the present invention, the crack preventing bump 195 is prepared on the first inorganic film 181, but is not limited to this structure. That is, the crack preventing bump 195 may be prepared on the base substrate 110 or the second inorganic film 183.

In the flexible display device according to the fourth embodiment of the present invention, the plurality of inorganic films included in the encapsulation layer 180 seals the organic films, and the crack preventing portion 190 of the organic insulating material and the crack preventing bump 195 of the inorganic insulating material are provided in the non-display area (NDA). Accordingly, even if the flexible display panel is curved, stress occurring in the inorganic films disposed in the non-display area (NDA) can be decreased, thereby preventing cracks. Also, moisture permeation into the display panel can be prevented, thereby improving reliability of the flexible display device.

Also, the crack preventing bump 195 is provided in the flexible display device according to the fourth example embodiment of the present invention. Even when scribing or bending the flexible display panel, the display area (DA) can be prevented from being cracked (affected) by the cracks, which might occur in the outermost area of the inorganic films disposed in the non-display area (NDA).

In addition, because the crack preventing bump 195 is provided in the flexible display device, a connection between the crack preventing portion 190 and the inorganic films disposed in the non-display area (NDA) can be enhanced. Accordingly, even if the display panel 100 is curved, the crack preventing portion 190 can be prevented from being separated from the inorganic film.

Figure 7A:
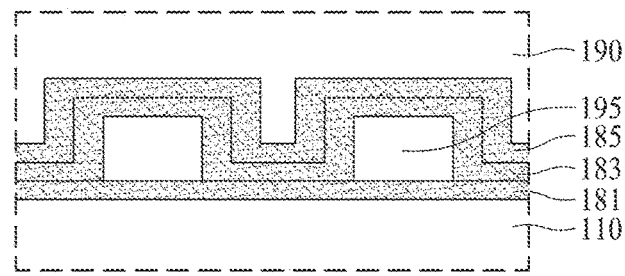
FIGS. 7A to 7C are cross sectional views illustrating modified embodiments of a crack preventing bump shown in FIG. 6.
Figure 7B:
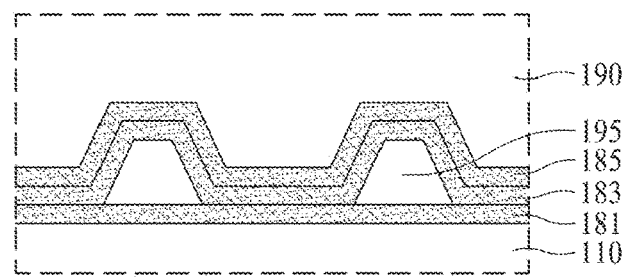
Figure 7C:
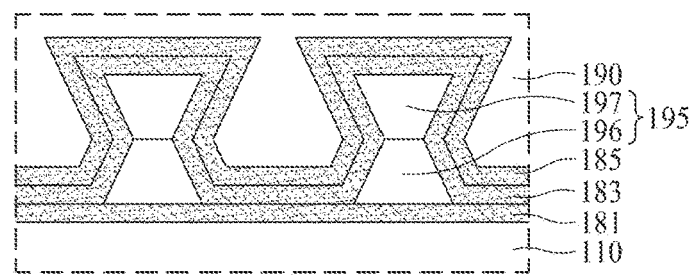

FIGS. 7A to 7C are cross sectional views illustrating modified embodiments of the crack preventing bump shown in FIG. 6, which show various shapes of the crack preventing bump in area 'A' of FIG. 6.

As illustrated in FIGS. 7A and 7B, a crack preventing bump 195 may have a rectangular shape in which a width in its upper surface is the same as a width in its lower surface, or may have a tapered shape in which a width in its upper surface is smaller than a width in its lower surface. In comparison to the reverse-tapered shape of the crack preventing bump 195 shown in FIG. 6, the rectangular shape and tapered shape of the crack preventing bump 195 shown in FIGS. 7A and 7B enable the increase of contact area between the crack preventing bump 195 and the inorganic film disposed under the crack preventing bump 195. Accordingly, the crack preventing bump 195 is stably fixed to the inorganic film.

As shown in FIG. 7C, a crack preventing bump 195 may include a first auxiliary crack preventing bump 196 and a second auxiliary crack preventing bump 197. In this case, the second auxiliary crack preventing bump 197 may be provided on the first auxiliary crack preventing bump 196. The first auxiliary crack preventing bump 196 may have a tapered shape, and the second auxiliary crack preventing bump 197 may have a reverse-tapered shape. An upper surface of the first auxiliary crack preventing bump 196 is in contact with a lower surface of the second auxiliary crack preventing bump 197. A width in the upper surface of the first auxiliary crack preventing bump 196 may be the same as a width in the lower surface of the second auxiliary crack preventing bump 197.

In comparison to the single-layered structure of the crack preventing bump, the crack preventing bump 195 including the first auxiliary crack preventing bump 196 and the second auxiliary crack preventing bump 197 prevents the display area (DA) from being cracked (affected) by the cracks of the inorganic films, which might occur in the outermost area of the display panel 100, with enhanced efficiency.

In addition, because the first auxiliary crack preventing bump 196 with the tapered shape is provided in the flexible display device in the example embodiment, a connection between the crack preventing bump and the first inorganic film 181 can be enhanced. At the same time, because the second auxiliary crack preventing bump 197 with the reverse-tapered shape is provided on the first auxiliary crack preventing bump 196, and the inorganic films are provided thereon, a connection between a crack preventing portion and the inorganic films can be enhanced.

Figure 8:
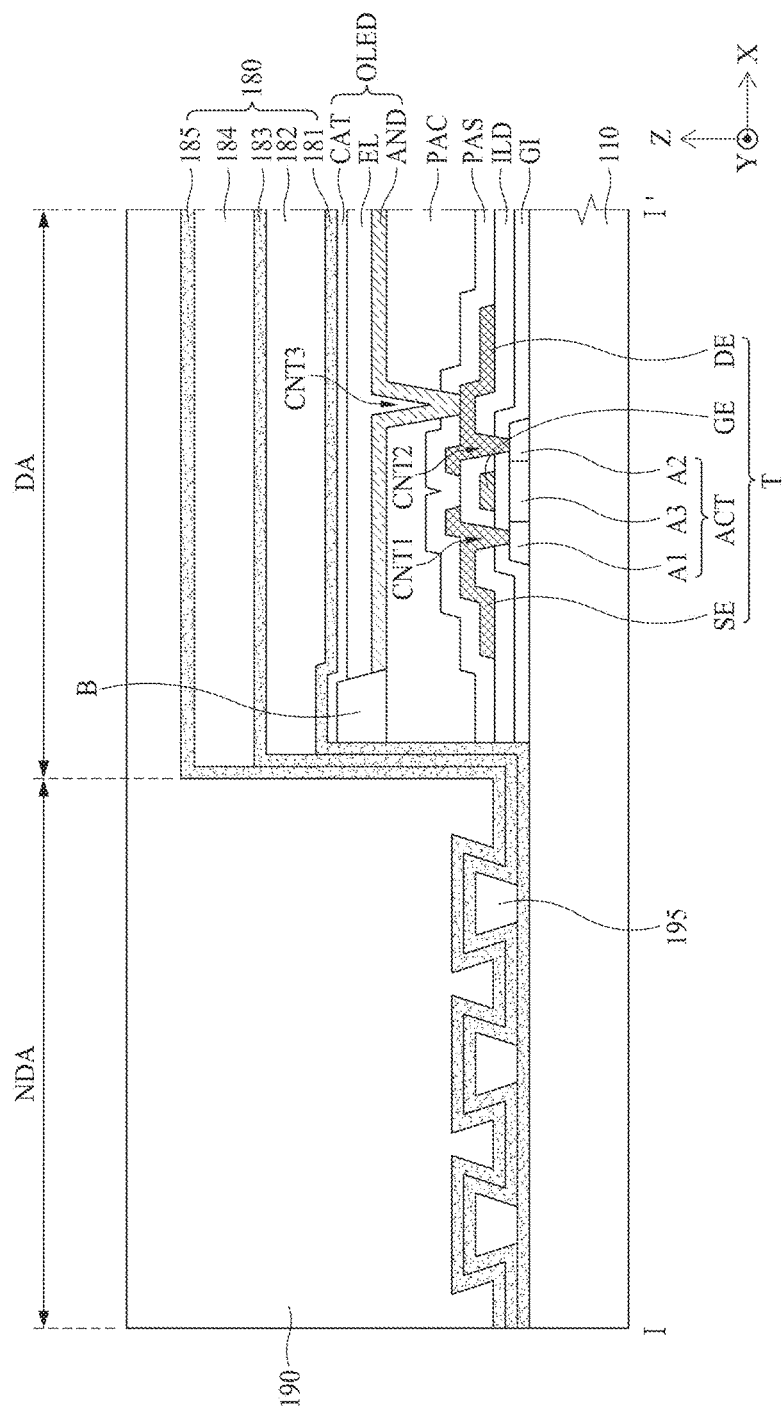
FIG. 8 is a cross sectional view illustrating a flexible display device according to a fifth example embodiment of the present invention.

FIG. 8 is a cross sectional view illustrating a flexible display device according to a fifth example embodiment of the present invention. Except for a crack preventing bump 195 additionally provided in a non-display area (NDA), the flexible display device according to the fifth example embodiment of the present invention is similar to as the flexible display device according to the second example embodiment of the present invention shown in FIG. 4. The crack preventing bump 195 has been described with reference to FIG. 6 and FIGS. 7A to 7C. Accordingly, the same reference numbers will be used throughout the drawings to refer to similar or like parts, and a repetitive description related with materials and structures of respective elements will be omitted.

With reference to FIG. 8, at least one crack preventing bump 195 may be provided in the non-display area (NDA) of the flexible display device according to the fifth example embodiment of the present invention. The crack preventing bum 195 is provided on a first inorganic film 181 provided in the non-display area (NDA). Then, second and third inorganic films 183 and 185 are sequentially deposited on the first inorganic film 181. The crack preventing bump 195 is sealed by the second and third inorganic films 183 and 185. A crack preventing portion 190 of an organic insulating material is provided on an entire surface of a base substrate 110. The crack preventing portion 190, which is on the crack preventing bump 195, seals the crack preventing bump 195.

As described above, the crack preventing bump 195 is additionally provided, and the crack preventing bump 195 is sealed by the crack preventing portion 190. Thus, even if a display panel of the flexible display device is curved, a stress occurring in the inorganic films disposed in the non-display area (NDA) can be decreased, thereby preventing cracks. Accordingly, reliability of the flexible display panel can be improved.

In comparison to the fourth example embodiment of the present invention in which the crack preventing portion 190 is provided only in the non-display area (NDA), the fifth example embodiment of the present invention includes the crack preventing portion 190, which covers an entire upper surface of an encapsulation layer 180, so that it is possible to prevent the boundaries between the display area (DA) and the non-display area (NDA). Thus, even if the display panel is curved, the crack preventing portion 190 can be prevented from being separated from the third inorganic film disposed in the display area (DA) by the boundaries between the display area (DA) and the non-display area (NDA).

If scribing or bending the flexible display panel in the flexible display device according to the fifth example embodiment of the present invention, the display area (DA) can be prevented from being cracked (affected) by the cracks that might occur in the outermost area of the inorganic films disposed in the non-display area (NDA).

Figure 9:
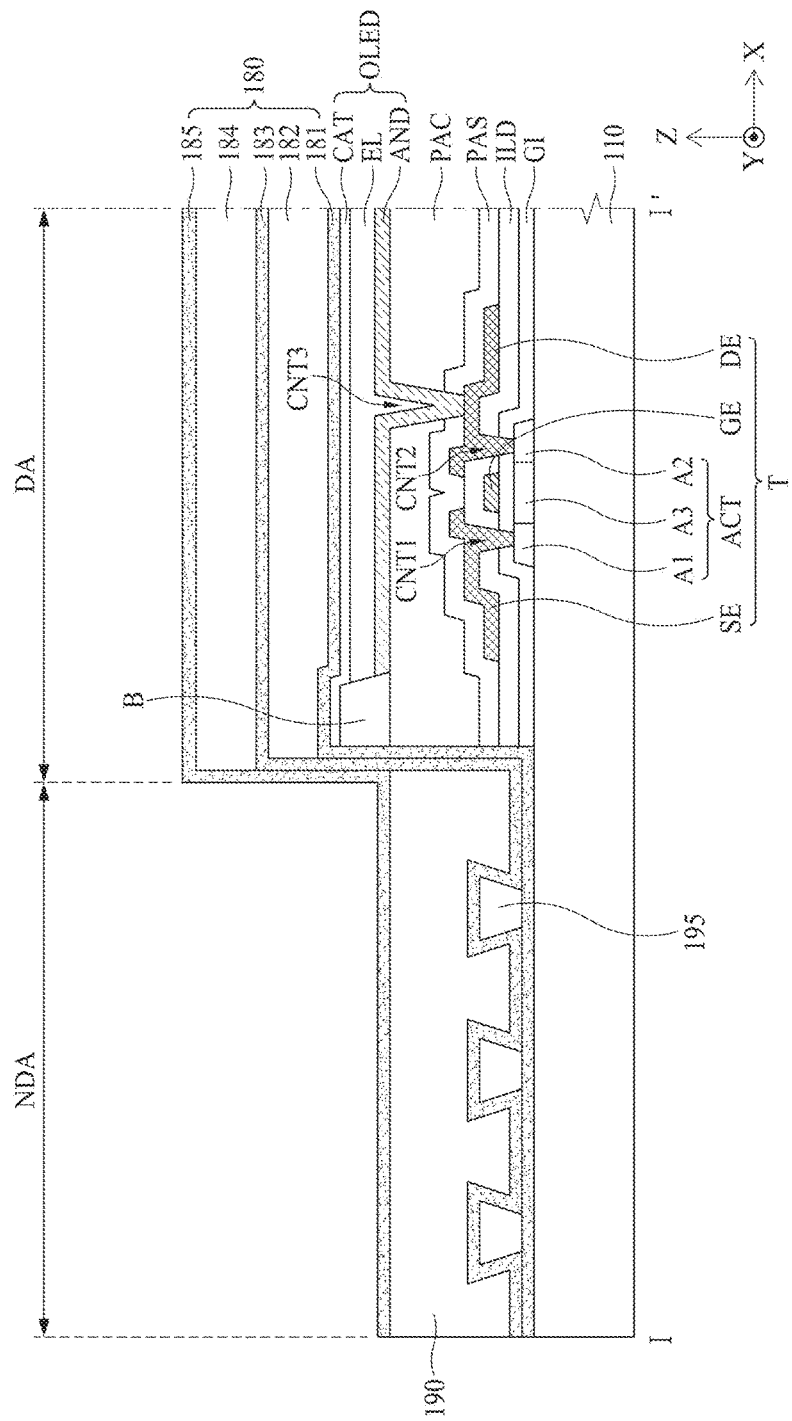
FIG. 9 is a cross sectional view illustrating a flexible display device according to a sixth example embodiment of the present invention.

FIG. 9 is a cross sectional view illustrating a flexible display device according to a sixth example embodiment of the present invention. Except for a crack preventing bump 195 additionally provided in a non-display area (NDA), the flexible display device according to the sixth embodiment of the present invention is similar to the flexible display device according to the third example embodiment of the present invention shown in FIG. 5. The crack preventing bump 195 has been described with reference to FIG. 6 and FIGS. 7A to 7C. Accordingly, the same reference numbers will be used throughout the drawings to refer to similar or like parts, and a repetitive description related with materials and structures of respective elements will be omitted.

As shown in FIG. 9, at least one crack preventing bump 195 may be provided in the non-display area (NDA) of the flexible display device according to the sixth example embodiment of the present invention. The crack preventing bump 195 is provided on a first inorganic film 181 provided in the non-display area (NDA). Then, a second inorganic film 183 is provided on the first inorganic film 181. The crack preventing bump 195 is sealed by the second inorganic film 183. A crack preventing portion 190 is provided on the second inorganic film 183 disposed in the non-display area (NDA). Then, a third inorganic film 185 extending from the display area (DA) is provided on the crack preventing portion 190.

In the sixth example embodiment of the present invention, the crack preventing bump 195 is disposed on the first inorganic film 181, but is not limited to this structure. That is, the crack preventing bump 195 may be provided on a base substrate 110 or the second inorganic film 183. In this case, the crack preventing portion 190 is provided on the crack preventing bump 195, thereby sealing the crack preventing bump 195.

The sixth example embodiment of the present invention provides a similar effect as the third embodiment of the present invention. Also, the crack preventing bump 195 is additionally provided in the flexible display device according to the sixth example embodiment of the present invention. Thus, even if the flexible display panel is curved, a stress occurring in the inorganic films disposed in the non-display area (NDA) can be decreased, thereby preventing cracks. Also, even when scribing the flexible display panel, the display area (DA) can be prevented from being cracked (affected) by the cracks which might occur in the outermost area of the inorganic films disposed in the non-display area (NDA).

Accordingly, the inorganic films included in the encapsulation layer seals the organic films, and the crack preventing portion of the organic insulating material is provided in the non-display area (NDA). Thus, even if the display panel is curved, a stress occurring in the inorganic films disposed in the non-display area (NDA) can be decreased, thereby preventing cracks. Accordingly, moisture permeation into display panel can be prevented, thereby improving reliability of the flexible display device.

Also, the crack preventing bump is additionally provided in the non-display area (NDA), and the crack preventing portion seals the crack preventing bump. Thus, even if the display panel is curved, cracks occurring in the inorganic films disposed in the non-display area (NDA) can be prevented.

Also, the crack preventing bump is provided in the flexible display device according to example embodiments of the present invention. Thus, even when scribing the flexible display panel, the display area (DA) can be prevented from being cracked (affected) by the cracks that might occur in the outermost area of the inorganic films disposed in the non-display area (NDA).

It will be apparent to those skilled in the art that various modifications and variations can be made in the flexible device of the present invention without departing from the spirit or scope of the invention. Thus, it is intended that the present invention covers the modifications and variations of this invention provided they come within the scope of the appended claims and their equivalents.

What is claimed is:

1. A flexible display device, comprising:
   a base substrate defining a display area and a non-display area;
   a thin film transistor in the display area of the base substrate;
   an organic light emitting diode on and connected with the thin film transistor;
   an encapsulation layer on the organic light emitting diode;
   a crack preventing portion in the non-display area defined by the base substrate; and
   a crack preventing bump in the non-display area of the base substrate,
   wherein the encapsulation layer includes a plurality of inorganic films that extend from the display area to the non-display area and a plurality of organic films that are alternately disposed with the plurality of inorganic films, wherein the plurality of inorganic films includes first, second, and third inorganic films deposited in sequence, and wherein the crack preventing bump is disposed between two adjacent inorganic films among the plurality of inorganic films in the non-display area, wherein at least one of the plurality of inorganic films is disposed between the crack preventing portion and the crack preventing bump in the non-display area, and the crack preventing portion covers an entire upper surface of the at least one of the inorganic films on the crack preventing bump and has a planarized upper surface.

2. The flexible display device according to claim 1, wherein each of the plurality of organic films is disposed in the display area, but is absent in the non-display area.

3. The flexible display device according to claim 2, wherein each of the plurality of organic films is interposed between adjacent ones of the inorganic films.

4. The flexible display device according to claim 1, wherein the crack preventing portion is formed of a same material as that of any one among the plurality of organic films.

5. The flexible display device according to claim 1, wherein an upper surface of the crack preventing portion is a same height as that of an upper surface of the encapsulation layer disposed in the display area.

6. The flexible display device according to claim 1, wherein the crack preventing portion extends from the non-display area to the display area such that the crack preventing portion covers an upper surface of the encapsulation layer in the display area.

7. The flexible display device according to claim 1, wherein the crack preventing portion is between the second and third inorganic films in the non-display area.

8. The flexible display device according to claim 1, wherein the crack preventing bump has a reverse-tapered shape in which a width of an upper surface therein is greater than a width of a lower surface thereof.

9. The flexible display device according to claim 1, wherein the crack preventing bump includes a first auxiliary crack preventing bump and a second auxiliary crack preventing bump, wherein the first auxiliary crack preventing bump has a tapered shape in which a width of an upper surface therein is less than a width of a lower surface thereof, and wherein the second auxiliary crack preventing bump has a reverse-tapered shape in which a width of an upper surface therein is greater than a width of a lower surface thereof.

10. The flexible display device according to claim 1, wherein the crack preventing portion is on the crack preventing bump and seals the crack preventing bump.

11. The flexible display device according to claim 1, wherein the crack preventing bump and the crack preventing portion are formed of different materials.

12. The flexible display device according to claim 1, further comprising a bank disposed adjacent to the third inorganic film.

13. The flexible display device according to claim 1, wherein the third inorganic film seals the organic light emitting diode.

14. The flexible display device according to claim 1, wherein the encapsulation layer directly contacts an entire upper surface of the organic light emitting diode.

15. The flexible display device according to claim 1, wherein no gap exists between a center of the organic light emitting diode and the encapsulation layer.

16. A flexible display device, comprising:
   a base substrate defining a display area and a non-display area;
   a thin film transistor in the display area of the base substrate;
   an organic light emitting diode on and connected with the thin film transistor;
   an encapsulation layer on the organic light emitting diode; and
   a crack preventing portion in the non-display area defined by the base substrate,
   wherein an upper surface of the crack preventing portion in the non-display area has a same height as that of an upper surface of the display; and
   wherein the crack preventing portion covers an entire upper surface of the encapsulation layer in the non-display area, and has a planarized upper surface.

17. The flexible display device according to claim 16, further comprising a crack preventing bump in the non-display area of the base substrate;
   wherein the encapsulation layer includes a plurality of inorganic films that extend from the display area to the non-display area and a plurality of organic films that are alternately disposed with the plurality of inorganic films,
   wherein the plurality of inorganic films includes first and second inorganic films deposited in sequence, and wherein all of the crack preventing bump is disposed on first inorganic film.

* * * * *